(12) United States Patent
Wang et al.

(10) Patent No.: US 11,261,892 B2
(45) Date of Patent: Mar. 1, 2022

(54) PULL AID STRUCTURE

(71) Applicant: FIVETECH TECHNOLOGY INC., New Taipei (TW)

(72) Inventors: Ting-Jui Wang, New Taipei (TW); Hornet Huang, New Taipei (TW)

(73) Assignee: FIVETECH TECHNOLOGY INC., New Taipei (TW)

(*) Notice: Subject to any disclaimer, the term of this patent is extended or adjusted under 35 U.S.C. 154(b) by 1090 days.

(21) Appl. No.: 15/864,091

(22) Filed: Jan. 8, 2018

(65) Prior Publication Data

US 2018/0238360 A1    Aug. 23, 2018

(30) Foreign Application Priority Data

Feb. 23, 2017   (TW) .................................. 106202673

(51) Int. Cl.
    *F16B 2/18*    (2006.01)
    *H05K 7/14*    (2006.01)
    *F16B 5/12*    (2006.01)

(52) U.S. Cl.
    CPC ........... *F16B 2/185* (2013.01); *H05K 7/1402* (2013.01); *H05K 7/1409* (2013.01); *F16B 5/121* (2013.01); *F16B 5/123* (2013.01)

(58) Field of Classification Search
    CPC . F16B 2/185; B25B 7/12; B25B 7/123; B25B 23/141; B25B 23/142; B25B 23/1427; B25B 13/46; B25B 13/461; B25B 13/468; H05K 7/1402; H05K 7/1407
    USPC ........................................................ 81/58.1
    See application file for complete search history.

(56) References Cited

U.S. PATENT DOCUMENTS

| 2,426,191 | A | * | 8/1947 | Feiring | .................. | B25B 13/46 |
| | | | | | | 81/111 |
| 2,508,568 | A | * | 5/1950 | Ellison | .................. | B25B 13/467 |
| | | | | | | 74/157 |
| 2,792,733 | A | * | 5/1957 | Walraven | ............ | B25B 23/1427 |
| | | | | | | 81/481 |
| 3,199,335 | A | * | 8/1965 | Holmes | .............. | H01R 43/0424 |
| | | | | | | 72/409.01 |
| 4,308,769 | A | * | 1/1982 | Rantanen | .............. | B25B 13/463 |
| | | | | | | 81/63 |
| 4,339,969 | A | * | 7/1982 | Hage | ..................... | B25B 13/467 |
| | | | | | | 81/57.39 |
| 4,425,828 | A | * | 1/1984 | Berdinner, Jr. | ......... | B25B 15/04 |
| | | | | | | 81/57.39 |

(Continued)

FOREIGN PATENT DOCUMENTS

| CN | 101221459 A | 7/2008 |
| CN | 207560581 U | 6/2018 |

*Primary Examiner* — Joel D Crandall
(74) *Attorney, Agent, or Firm* — Schmeiser, Olsen & Watts, LLP

(57) ABSTRACT

A pull aid structure includes a handle; a connecting element movably disposed at the handle; and a positioning element disposed at the handle and movably coupled to the connecting element. The pull aid structure enables a user to place the connecting element on an object, rotate the handle to fasten another object, confine the positioning element to the connecting element, and compress an elastic element, so as to couple together the two objects. To remove one of the objects, the user separates the positioning element and the connecting element to thereby separate the two objects, thereby achieving quick coupling and ease of removal.

13 Claims, 22 Drawing Sheets

(56) References Cited

U.S. PATENT DOCUMENTS

| | | | | |
|---|---|---|---|---|
| 5,309,796 A | * | 5/1994 | Jones | B25B 13/463 81/57.39 |
| 5,671,643 A | * | 9/1997 | Henkhaus | B25B 13/461 81/57.39 |
| 6,502,485 B1 | * | 1/2003 | Salazar | B25B 13/463 173/93.7 |

* cited by examiner

PULL AID STRUCTURE

CROSS-REFERENCE TO RELATED APPLICATION

This non-provisional application claims priority under 35 U.S.C. § 119(a) on Patent Application No(s). 106202673 filed in Taiwan, R.O.C. on Feb. 23, 2017, the entire contents of which are hereby incorporated by reference.

FIELD OF THE INVENTION

The present invention relates to pull aid structures and, more particularly, to a pull aid structure for fastening two objects to achieve quick coupling and ease of removal.

BACKGROUND OF THE INVENTION

The prior art involves coupling two objects, for example, coupling and fixing the two objects, such as a panel and a circuit board, to the inside of a case with screws and by direct latching. Although the two objects can be coupled together, removal of one of the objects requires loosening the screws and then taking out the object by hand. Furthermore, the prior art lacks any special mechanism for assisting users in taking out the objects and thus lacks ease of use.

Accordingly, it is imperative to provide a pull aid structure with a view to overcoming the aforesaid drawbacks of the prior art.

SUMMARY OF THE INVENTION

In view of the aforesaid drawbacks of the prior art, the inventor of the present invention conceived room for improvement in the prior art and thus conducted extensive researches and experiments according to the inventor's years of experience in the related industry, and finally developed a pull aid structure as disclosed in the present invention to fasten two objects in such a manner to achieve quick coupling and ease of removal.

In order to achieve the above and other objectives, the present invention provides a pull aid structure, comprising: a handle; a connecting element movably disposed at the handle; and a positioning element disposed at the handle and movably coupled to the connecting element. The positioning element has a corresponding portion. The corresponding portion is movably coupled to an adjoining portion of the connecting element. Therefore, as soon as the positioning element escapes from the connecting element, the handle escapes from the connecting element and thus rotates or moves.

Regarding the pull aid structure, the connecting element has an elastic element.

Regarding the pull aid structure, the handle has an abutting portion.

Regarding the pull aid structure, the handle has a receiving space for receiving the connecting element and the positioning element.

Regarding the pull aid structure, the connecting element has a rotating shaft connected to the handle.

Regarding the pull aid structure, the rotating shaft is connected to the handle by a joining element.

Regarding the pull aid structure, the connecting element has a fixing portion.

Regarding the pull aid structure, the adjoining portion of the connecting element is movably coupled to, confined to, adapted to interfere with or engaged with the positioning element.

Regarding the pull aid structure, the elastic element is disposed outside or inside the connecting element, and the elastic element has two ends disposed at the handle and the connecting element, respectively.

Regarding the pull aid structure, the positioning element comprises a thrusting rod, an actuating rod, and a connector for connecting the thrusting rod and the actuating rod.

Regarding the pull aid structure, the thrusting rod has a pressing portion disposed at an end of the handle and a rod body connected to the connector.

Regarding the pull aid structure, the actuating rod has an extending portion connected to the connector and a corresponding portion connected to the extending portion and movably coupled to, confined to, adapted to interfere with or engaged with the connecting element.

Regarding the pull aid structure, the positioning element comprises a pressing portion disposed at an end of the handle and an actuating rod connected to the pressing portion.

Regarding the pull aid structure, the pressing portion and the actuating rod are fastened, adhered, latched, riveted, expanded, engaged or snap-engaged together or are integrally formed.

Regarding the pull aid structure, the actuating rod has a corresponding portion movably coupled to, confined to, adapted to interfere with or engaged with the connecting element.

Regarding the pull aid structure, the elastic element is a coil spring, a saucer-shaped leaf spring, a C-shaped leaf spring, a wave-shaped leaf spring, an elastic post, a leaf spring or a torsion spring.

Regarding the pull aid structure, the positioning element comprises a pressing portion disposed at an end of the handle and an actuating rod connected to the pressing portion, wherein the corresponding portion is connected to the actuating rod and movably coupled to, confined to, adapted to interfere with or engaged with the adjoining portion.

Regarding the pull aid structure, the connecting element comprises a connection unit disposed at the rotating shaft.

Regarding the pull aid structure, a positioning portion is disposed at the bottom of the connection unit.

Regarding the pull aid structure, a first thrust element and a second thrust element are disposed between the handle and the connecting element or between the handle and the rotating shaft.

Regarding the pull aid structure, the positioning element is a convex portion or a concave portion, whereas the connection unit of the connecting element has a dent portion or a protrusion portion movably adjoining a convex portion or a concave portion.

Regarding the pull aid structure, the fixing portion is a protuberance, a dent, an external thread, an internal thread, a buckle, a cascade, a plane, an arcuate surface, a curved surface or an oblique surface.

Regarding the pull aid structure, the fixing portion is riveted, expanded, latched, soldered, fastened, adhered or bolted to an object.

Regarding the pull aid structure, the positioning portion is a protuberance, a dent, an external thread, an internal thread, a buckle, a cascade, a plane, an arcuate surface, a curved surface or an oblique surface.

Regarding the pull aid structure, the adjoining portion is a hole, a slot, a protuberance, a dent, a cascade, an arcuate surface, a plane, an oblique surface, a curved surface or a buckle.

Regarding the pull aid structure, the pull aid structure and another object together form a module.

Regarding the pull aid structure, the other object is a panel, a box, a plate, a block, a motherboard or a casing.

Regarding the pull aid structure, the positioning element and the handle are movably connected by the connector.

Regarding the pull aid structure, the connector is a bolt, a buckle or a post, or is integrally formed with the positioning element or the handle.

Regarding the pull aid structure, the handle or the positioning element has a movable portion whereby the positioning element moves horizontally or vertically.

Regarding the pull aid structure, a space within which the movable portion moves ranges from 0.05 mm to 500 mm.

Regarding the pull aid structure, the abutting portion is for thrusting or fastening an object corresponding in position to and connected to the abutting portion.

Regarding the pull aid structure, an elastic portion is disposed between the actuating rod and the handle.

Regarding the pull aid structure, the elastic portion is a coil spring, a saucer-shaped leaf spring, a C-shaped leaf spring, a wave-shaped leaf spring, an elastic post, a leaf spring or a torsion spring.

Regarding the pull aid structure, the positioning element is connected to or engaged with the handle or connected thereto by a connector.

Regarding the pull aid structure, the connector is disposed at the actuating rod of the positioning element.

Regarding the pull aid structure, the movable portion is disposed at the actuating rod of the positioning element.

Regarding the pull aid structure, the elastic element has its two ends fixed in place to exert a force such that the handle and the connecting element elastically rotate by 5 to 360 degrees.

Regarding the pull aid structure, the rotating shaft has a blocking portion and the connecting element are connected to each other or confined to each other.

Regarding the pull aid structure, the joining element is an axle, a buckle or a post or is integrally formed with the rotating shaft or the handle.

Regarding the pull aid structure, the positioning element has a pressing portion disposed at an end of the handle.

Regarding the pull aid structure, the corresponding portion is a protuberance, a dent, an external thread, an internal thread, a buckle, a cascade, a plane, an arcuate surface, a curved surface, an oblique surface, a slot or a hook.

Regarding the pull aid structure, the corresponding portion of the positioning element is movably coupled to, confined to, adapted to interfere with or engaged with the adjoining portion.

Regarding the pull aid structure, the positioning element has an engaging convex portion, whereas the connection unit of the connecting element has a notch portion movably engaged with the engaging convex portion.

Regarding the pull aid structure, an elastic component is disposed between the positioning element and the handle.

Regarding the pull aid structure, the handle has a stopping portion, and the connecting element has a corresponding checking portion such that the corresponding checking portion and the stopping portion are confined to each other or adapted to stop each other.

Regarding the pull aid structure, the corresponding portion of the positioning element is integrally formed with the handle or is a bump, a protuberance, a dent, a slot, a hole, a buckle, a hook, a plate or a block which is connectedly formed to restrict the adjoining portion of the connecting element.

Regarding the pull aid structure, a first thrust element or a second thrust element is disposed between the handle and the connecting element.

Therefore, a pull aid structure of the present invention enables a user to place a connecting element on an object, rotate a handle to fasten another object, confine a positioning element to the connecting element, and compress an elastic element, so as to couple together the two objects. To remove one of the objects, the user separates the positioning element and the connecting element such that the handle is released by the elastic element and thus automatically springs forward to thereby separate the two objects, thereby achieving quick coupling and ease of removal.

BRIEF DESCRIPTION OF THE DRAWINGS

Objectives, features, and advantages of the present invention are hereunder illustrated with specific embodiments in conjunction with the accompanying drawings, in which.

DETAILED DESCRIPTION OF THE PREFERRED EMBODIMENTS

Figure 1:
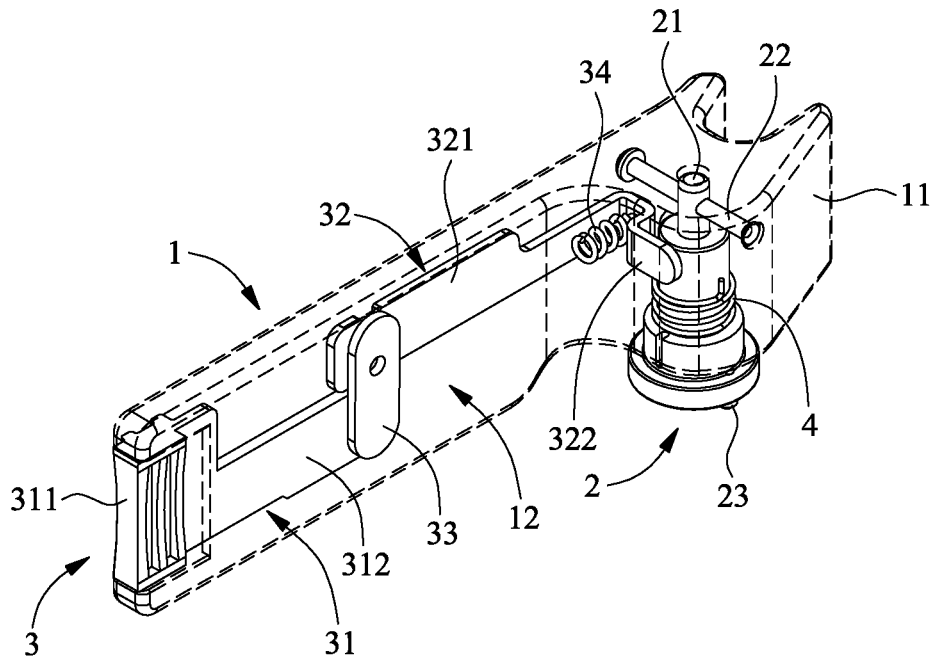
FIG. 1 is a perspective schematic view of a latched state according to the first embodiment of the present invention.
Figure 2:
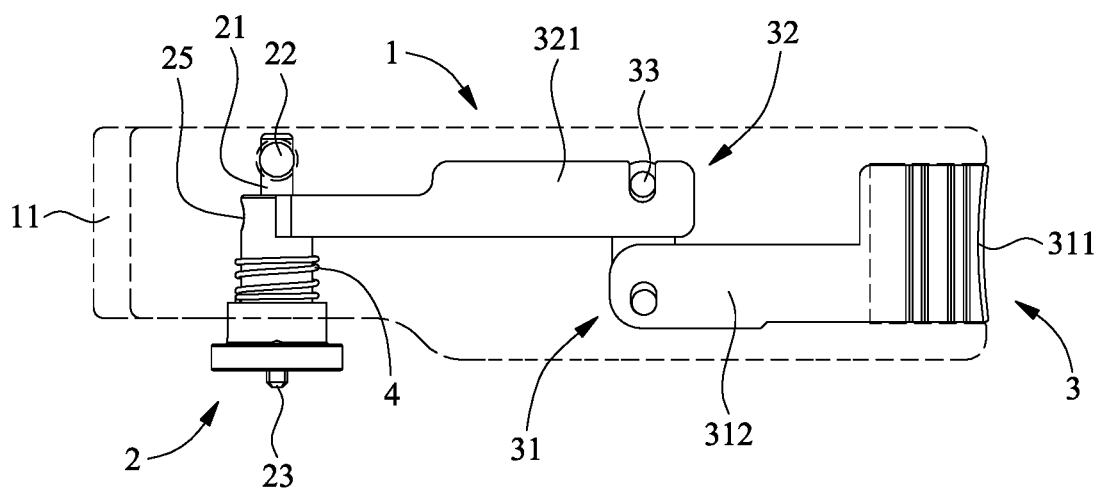
FIG. 2 is a lateral schematic view of a latched state according to the first embodiment of the present invention.
Figure 3:
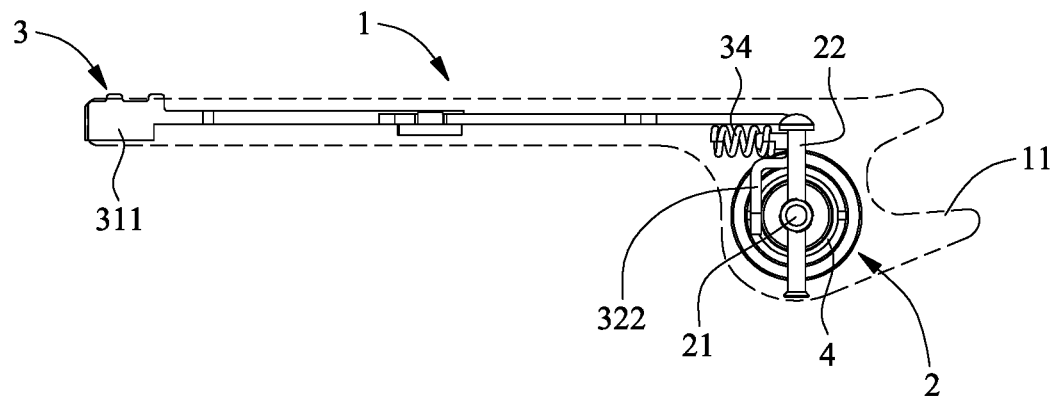
FIG. 3 is a top schematic view of a latched state according to the first embodiment of the present invention.
Figure 4:
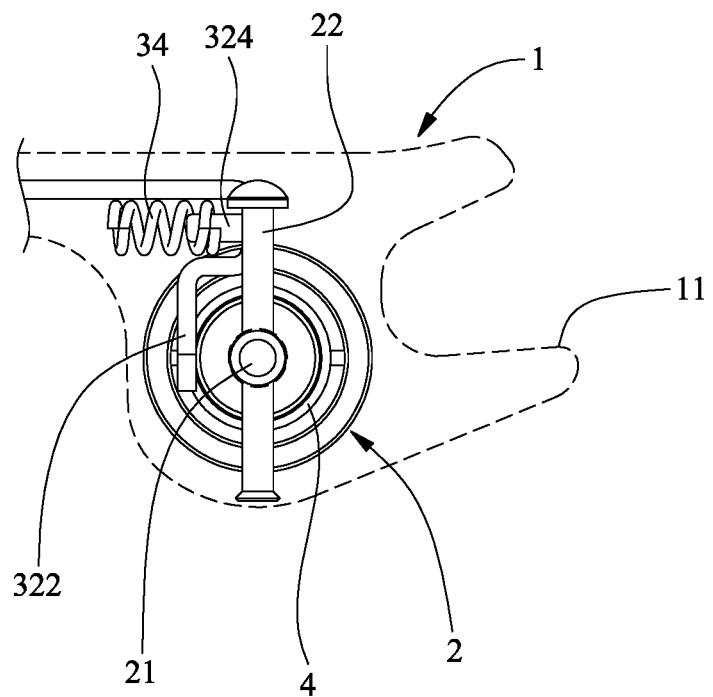
FIG. 4 is a partial enlarged schematic view of a latched state according to the first embodiment of the present invention.
Figure 5:
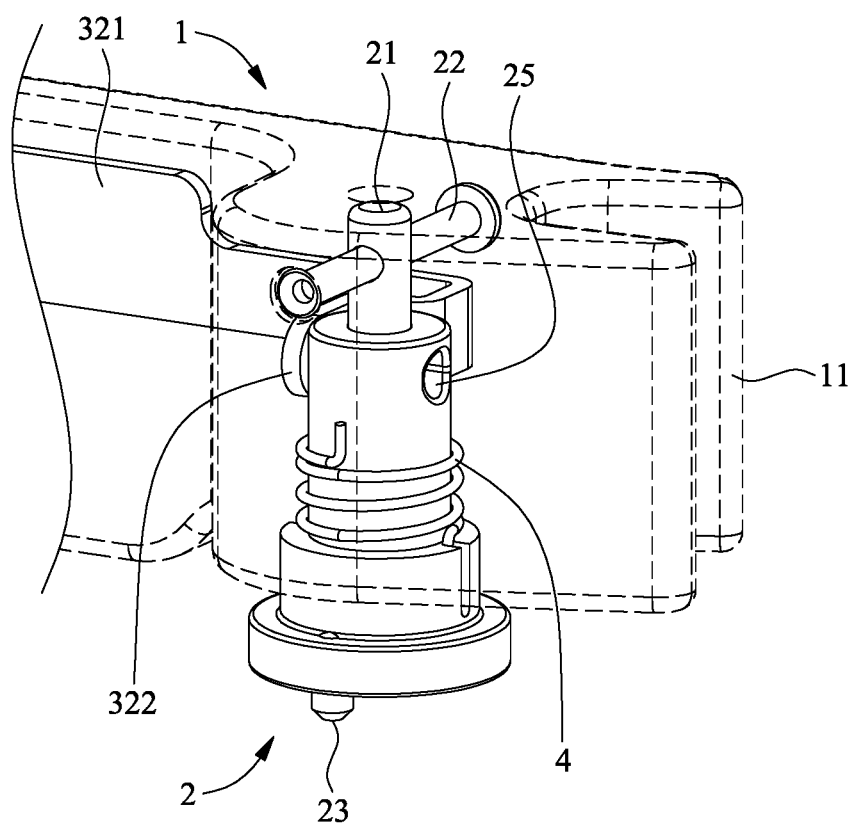
FIG. 5 is another partial enlarged schematic view of a latched state according to the first embodiment of the present invention.
Figure 6:
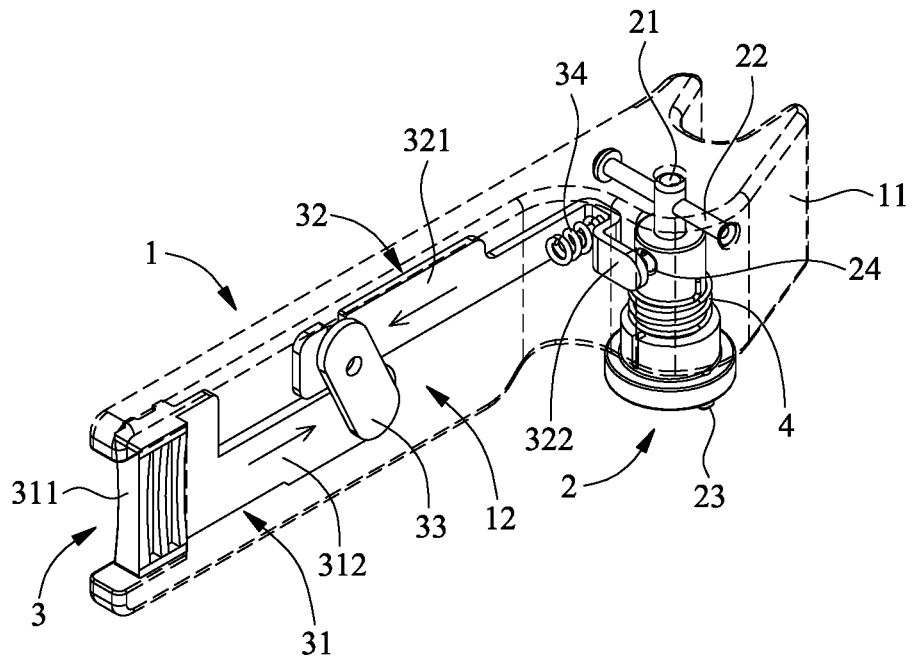
FIG. 6 is a perspective schematic view of an unlatched state according to the first embodiment of the present invention.
Figure 7:
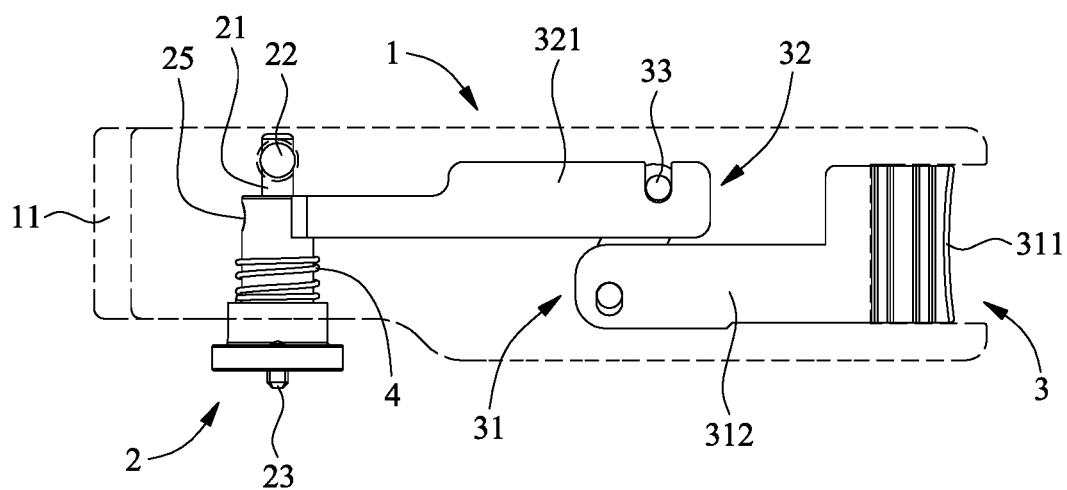
FIG. 7 is a lateral schematic view of an unlatched state according to the first embodiment of the present invention.
Figure 8:
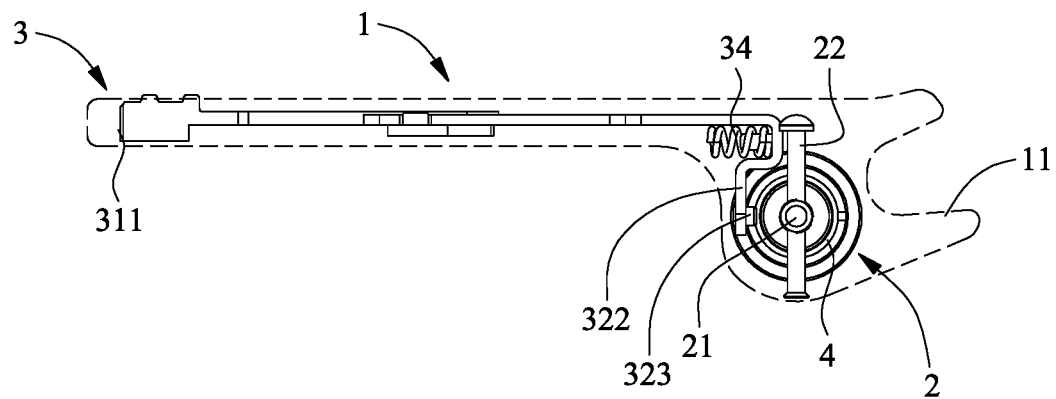
FIG. 8 is a top schematic view of an unlatched state according to the first embodiment of the present invention.
Figure 9:
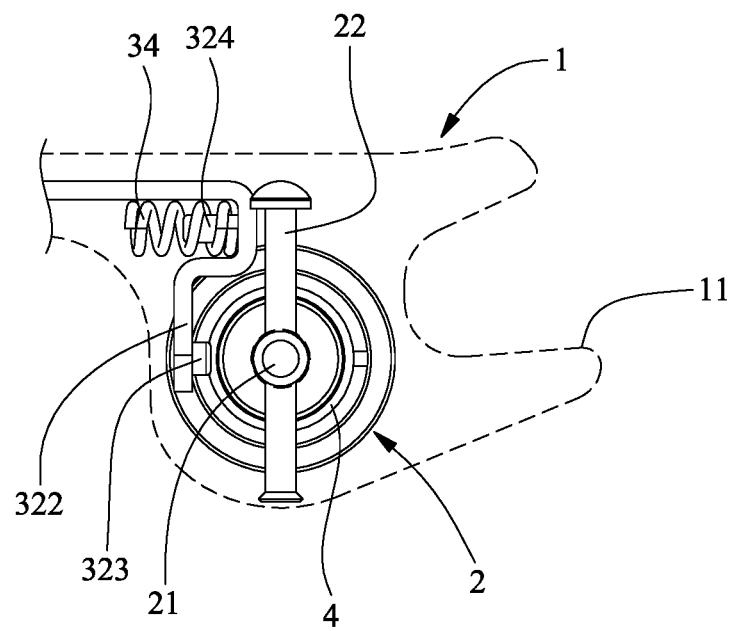
FIG. 9 is a partial enlarged schematic view of an unlatched state according to the first embodiment of the present invention.
Figure 10:
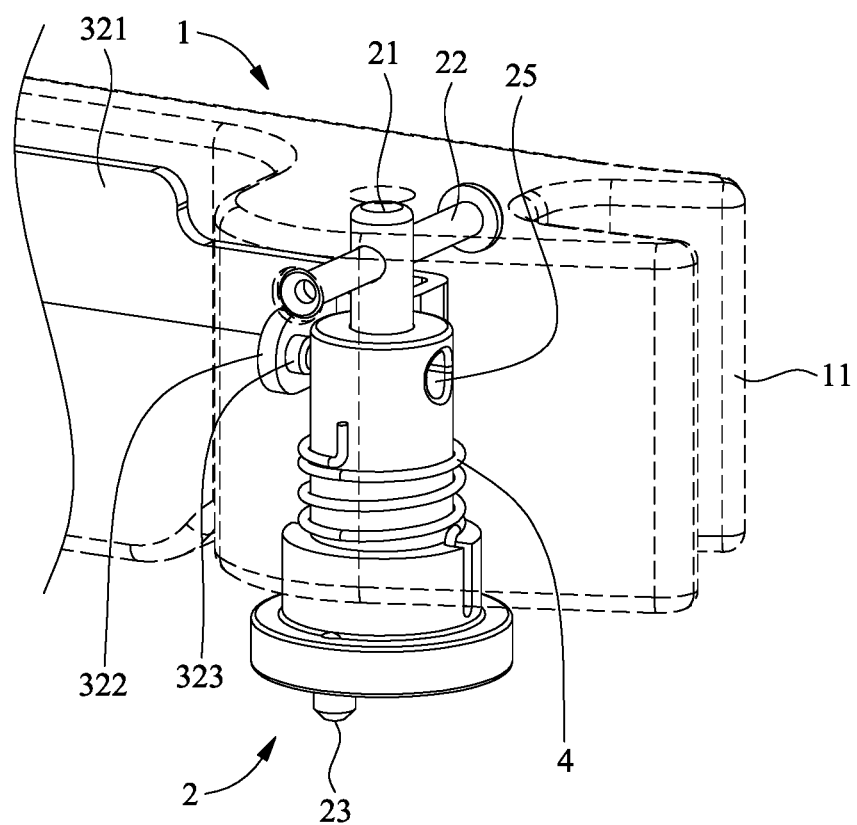
FIG. 10 is another partial enlarged schematic view of an unlatched state according to the first embodiment of the present invention.
Figure 11:
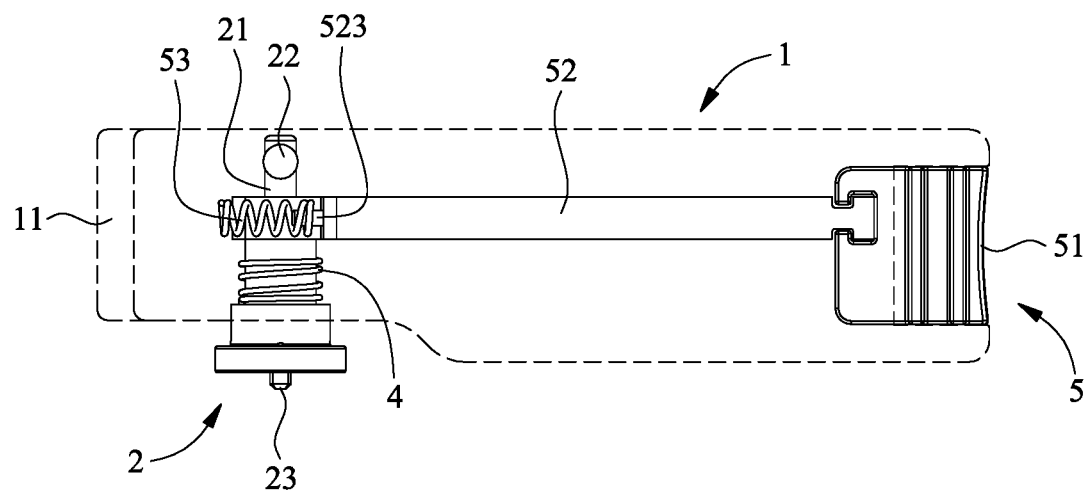
FIG. 11 is a lateral schematic view of a latched state according to the second embodiment of the present invention.
Figure 12:
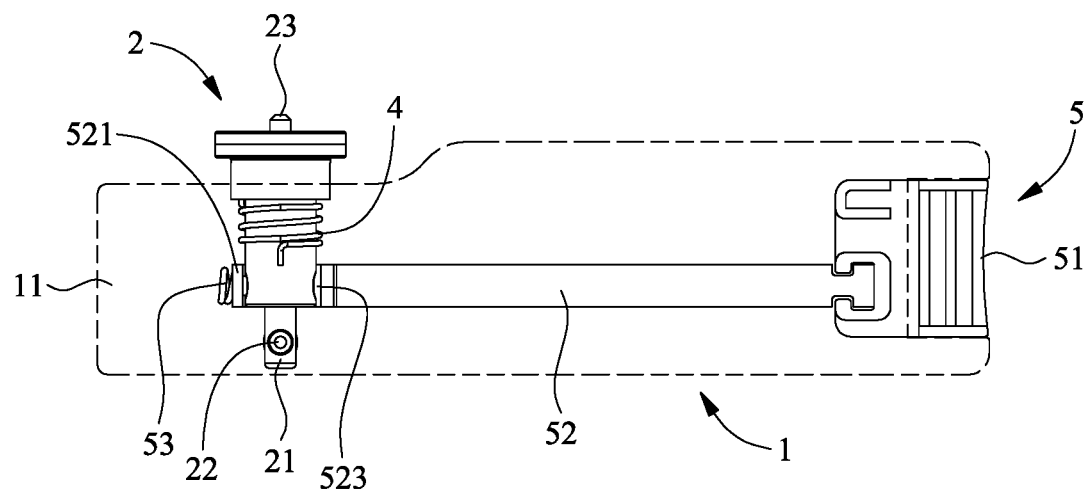
FIG. 12 is another lateral schematic view of a latched state according to the second embodiment of the present invention.
Figure 13:
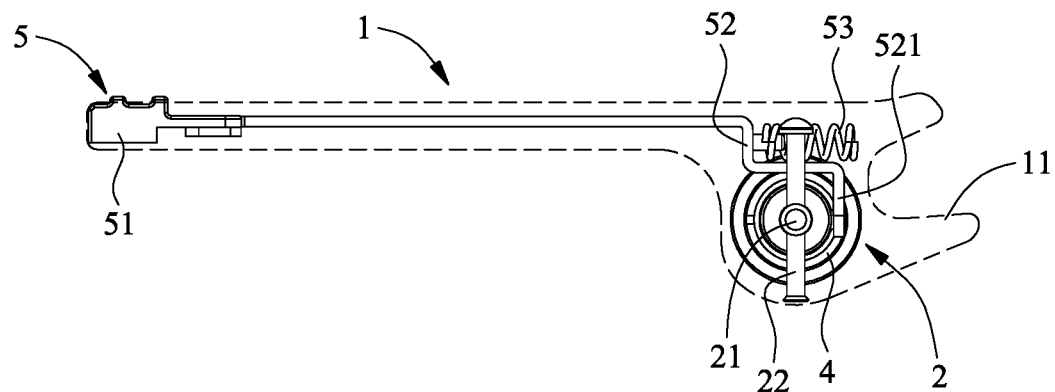
FIG. 13 is a top schematic view of a latched state according to the second embodiment of the present invention.
Figure 14:
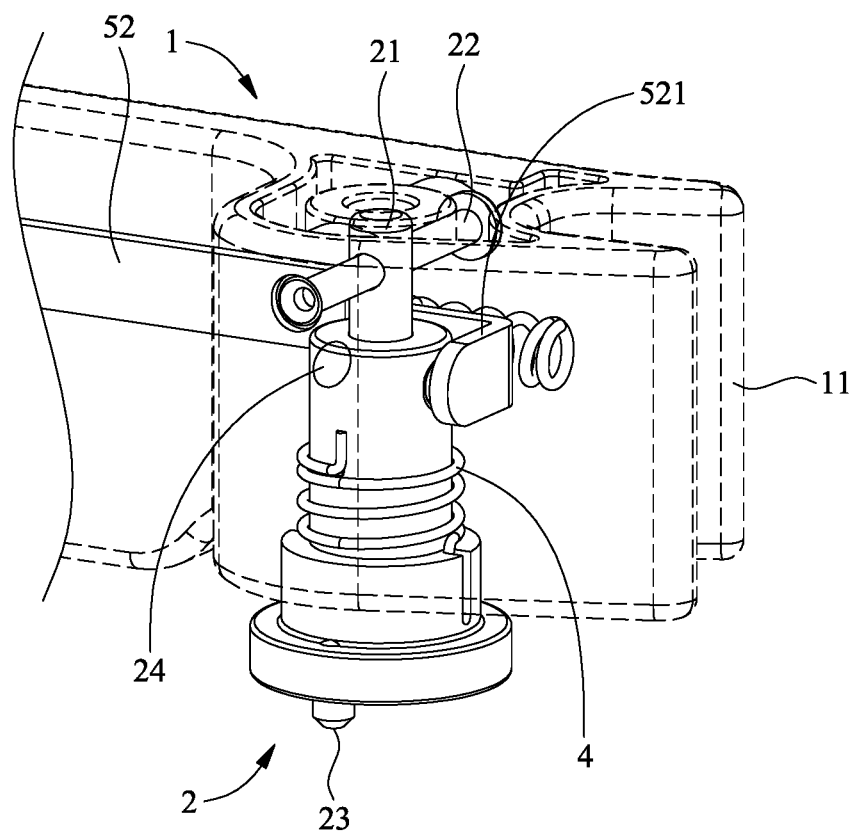
FIG. 14 is a partial enlarged schematic view of a latched state according to the second embodiment of the present invention.
Figure 15:
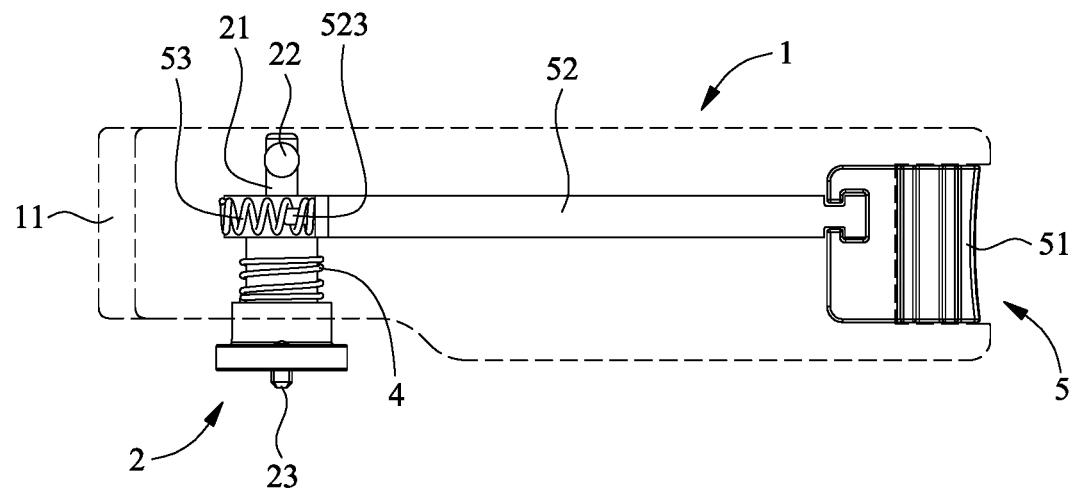
FIG. 15 is a lateral schematic view of an unlatched state according to the second embodiment of the present invention.
Figure 16:
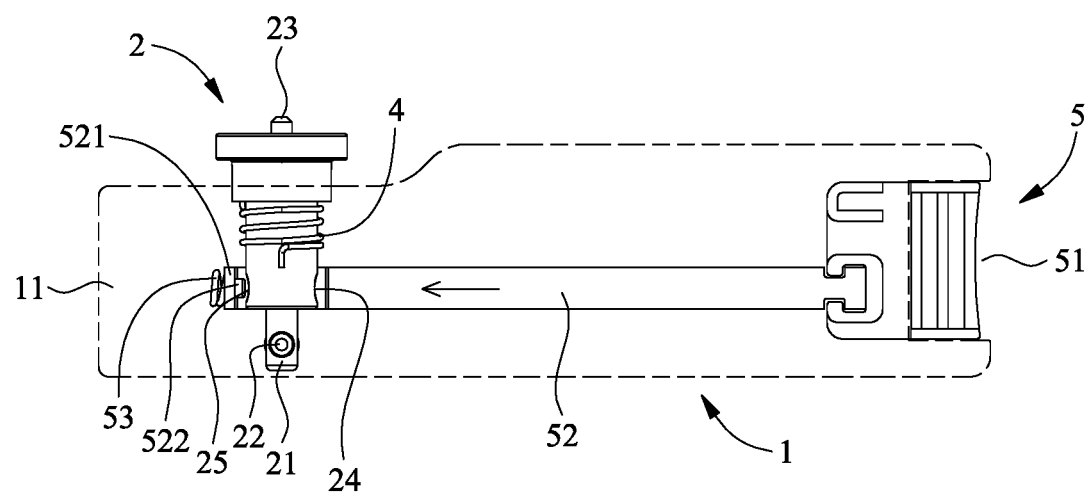
FIG. 16 is another lateral schematic view of an unlatched state according to the second embodiment of the present invention.
Figure 17:
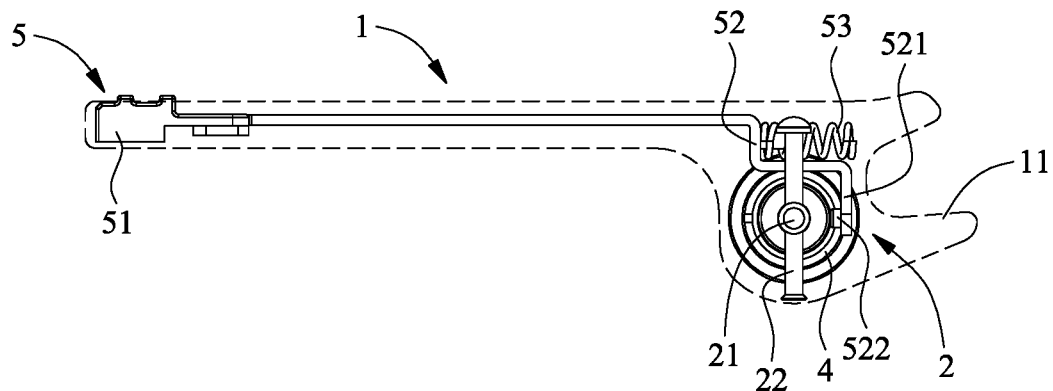
FIG. 17 is a top schematic view of an unlatched state according to the second embodiment of the present invention.
Figure 18:
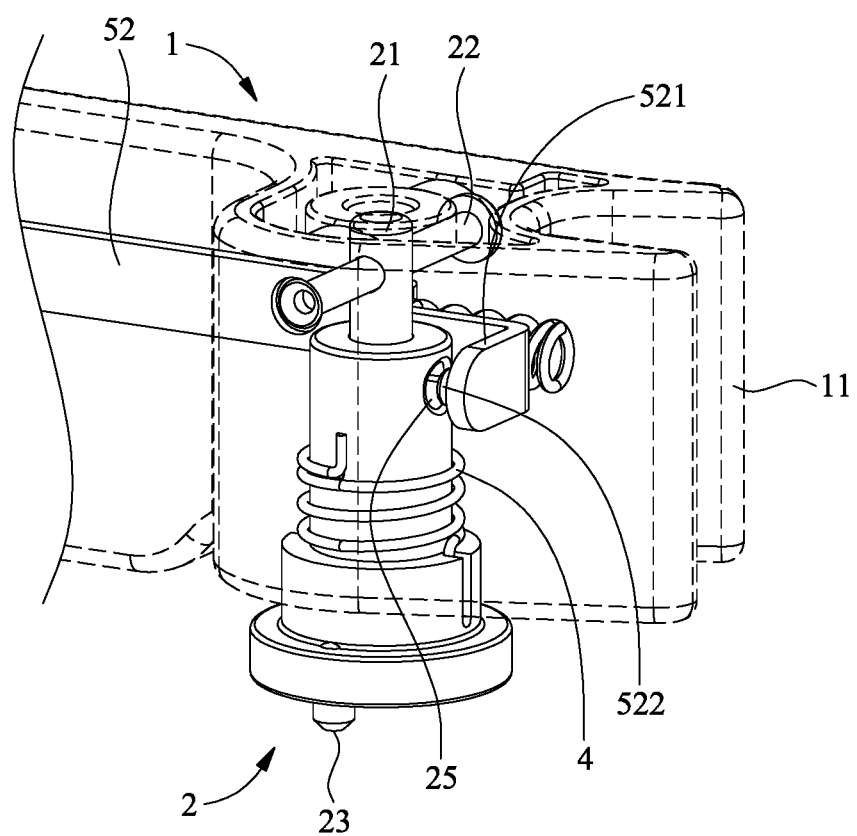
FIG. 18 is a partial enlarged schematic view of an unlatched state according to the second embodiment of the present invention.
Figure 19:
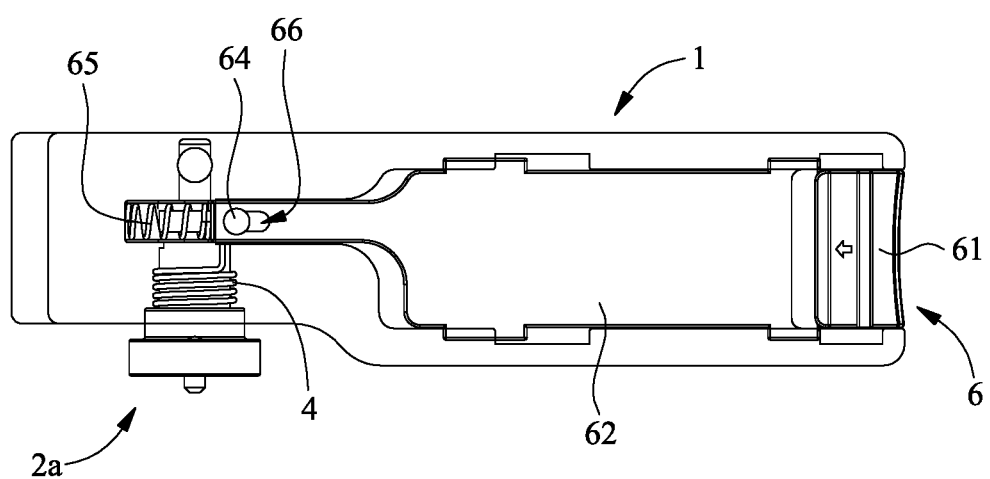
FIG. 19 is a perspective schematic view of a latched state according to the third embodiment of the present invention.
Figure 20:
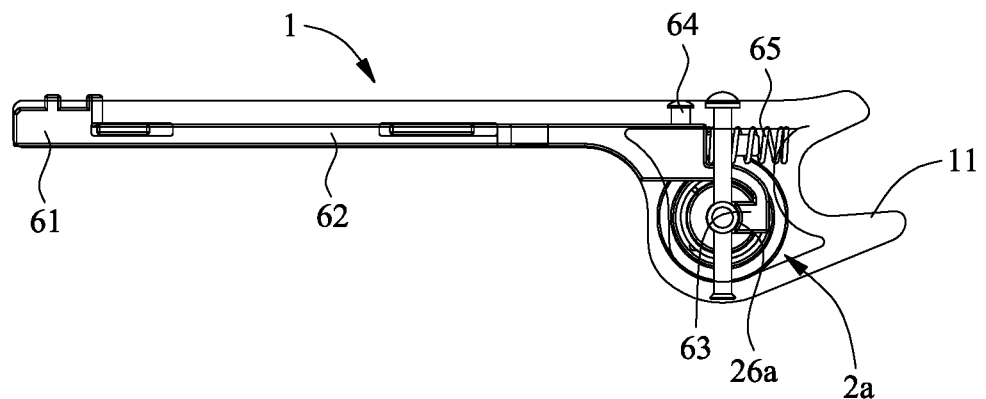
FIG. 20 is a top schematic view of a latched state according to the third embodiment of the present invention.
Figure 21:
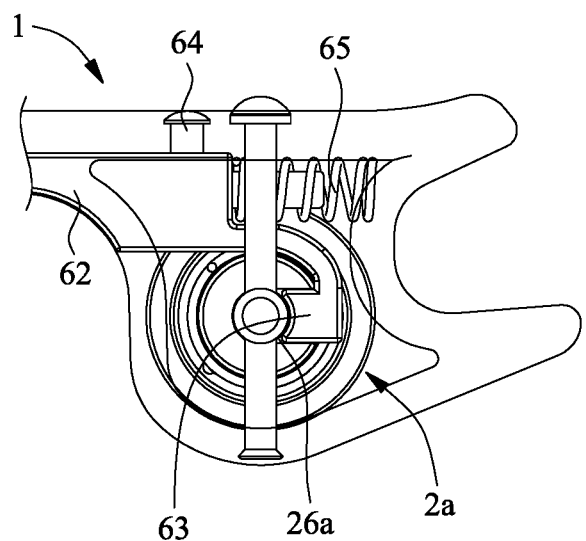
FIG. 21 is a partial enlarged schematic view of a latched state according to the third embodiment of the present invention.
Figure 22:
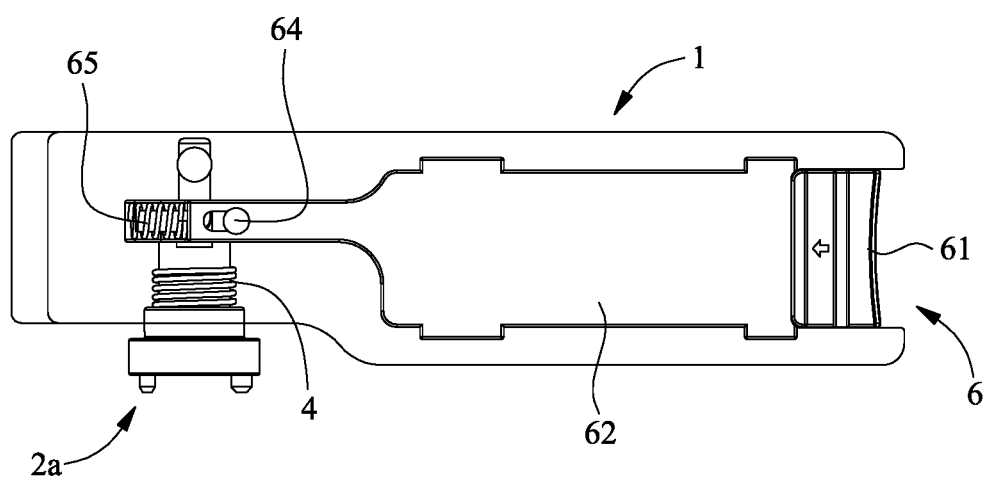
FIG. 22 is a perspective schematic view of an unlatched state according to the third embodiment of the present invention.
Figure 23:
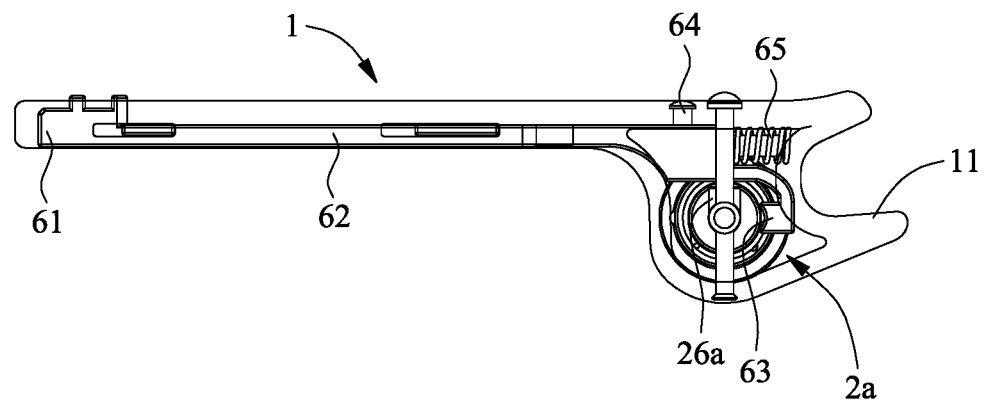
FIG. 23 is a top schematic view of an unlatched state according to the third embodiment of the present invention.
Figure 24:
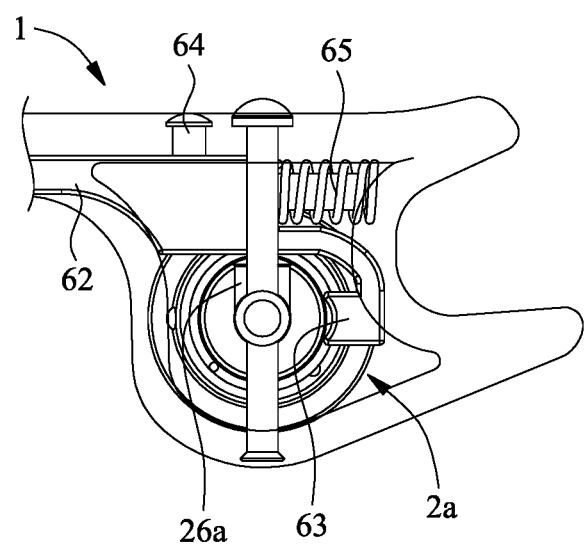
FIG. 24 is a partial enlarged schematic view of an unlatched state according to the third embodiment of the present invention.
Figure 25:
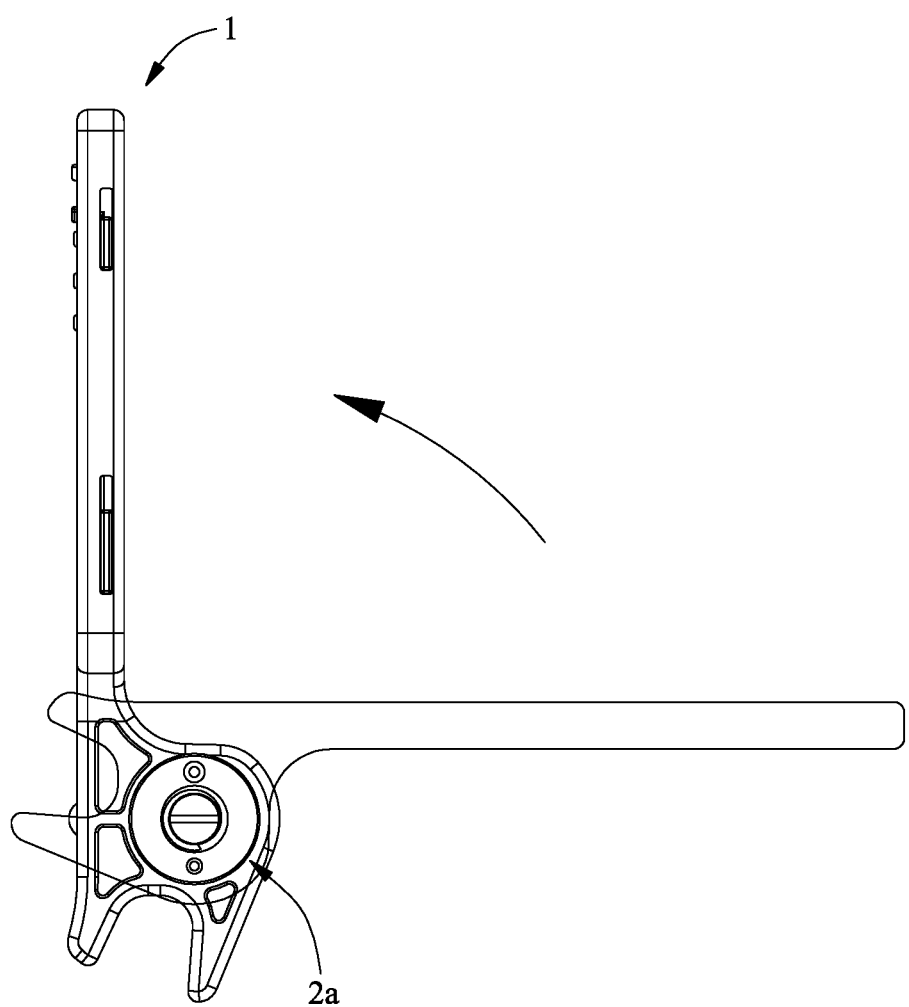
FIG. 25 is a schematic view of rotation and an unlatched state according to the third embodiment of the present invention.
Figure 26:
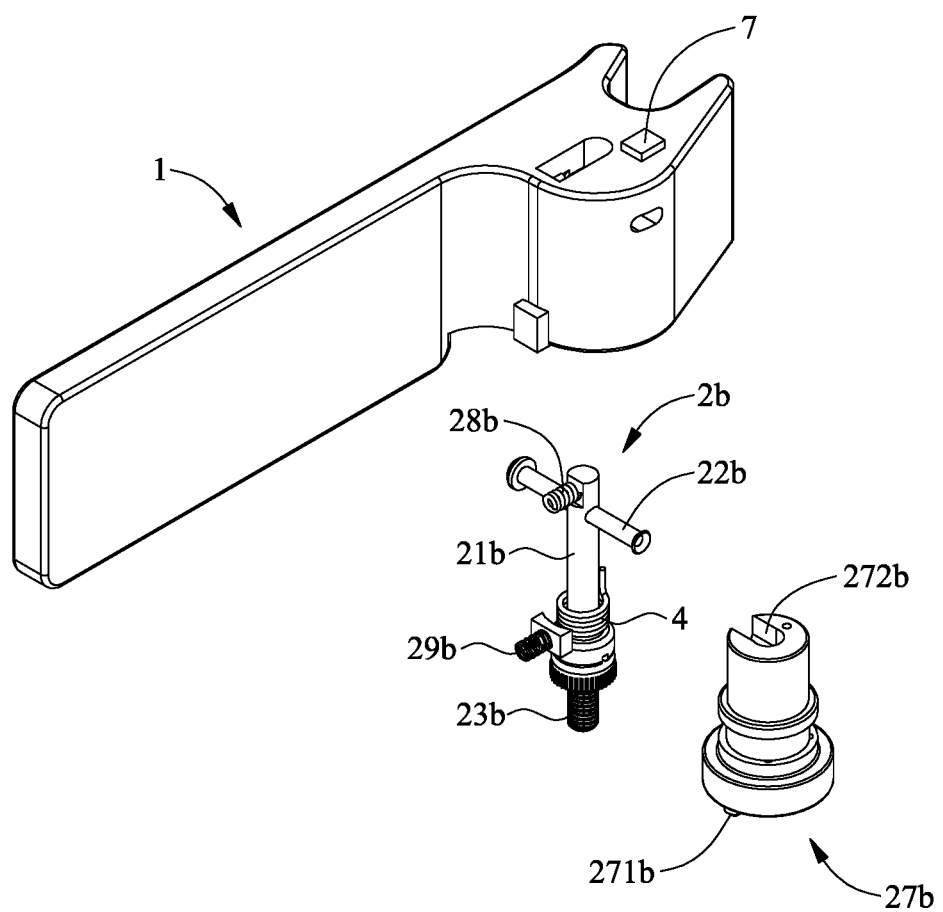
FIG. 26 is an exploded schematic view of the fourth embodiment of the present invention.
Figure 27:
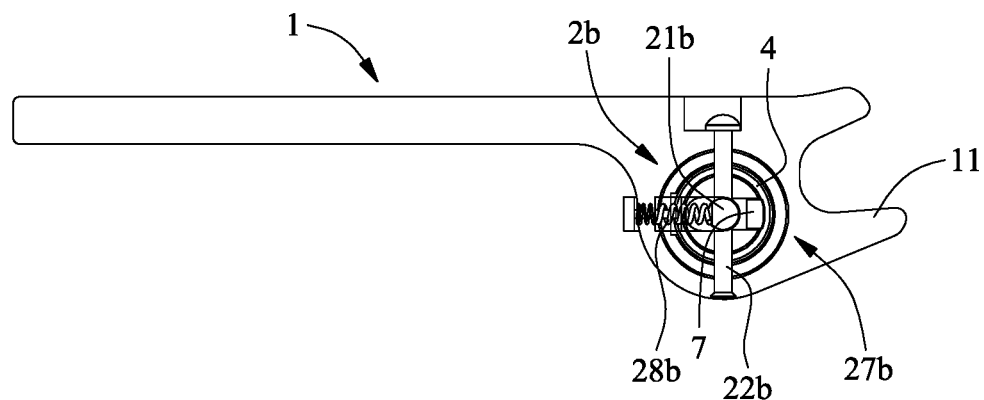
FIG. 27 is a top schematic view of a latched state according to the fourth embodiment of the present invention.
Figure 28:
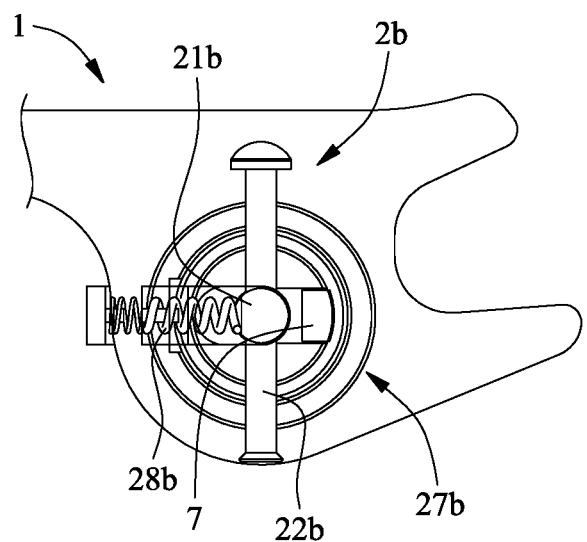
FIG. 28 is a partial enlarged schematic view of a latched state according to the fourth embodiment of the present invention.
Figure 29:
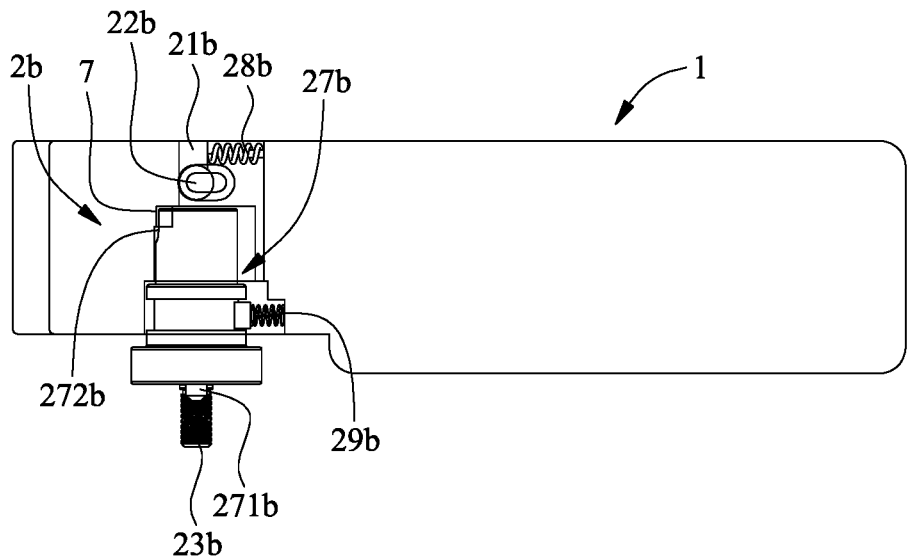
FIG. 29 is another partial enlarged schematic view of a latched state according to the fourth embodiment of the present invention.
Figure 30:
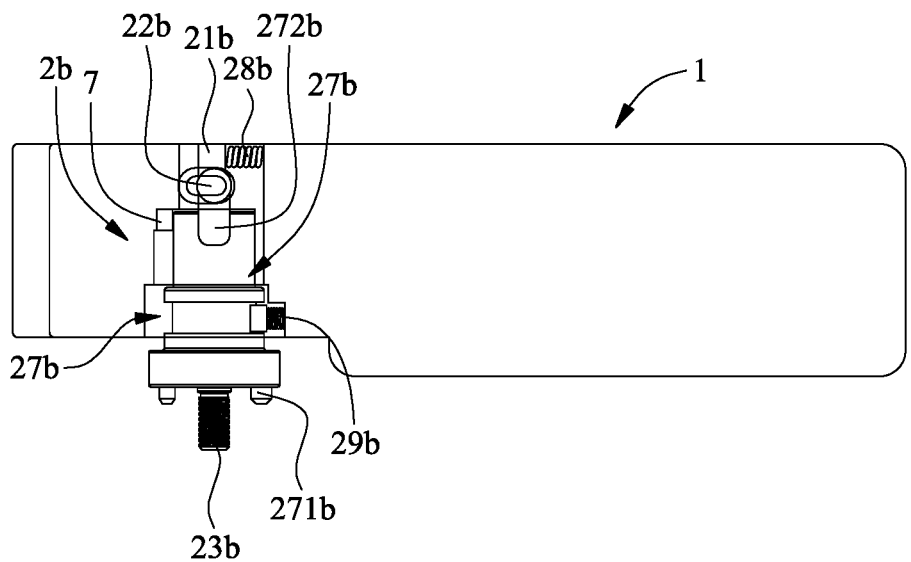
FIG. 30 is a perspective schematic view of an unlatched state according to the fourth embodiment of the present invention.
Figure 31:
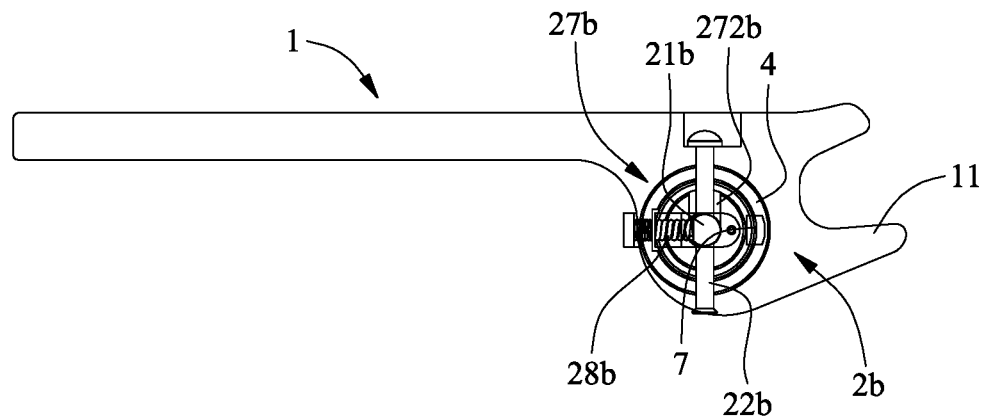
FIG. 31 is a top schematic view of an unlatched state according to the fourth embodiment of the present invention.
Figure 32:
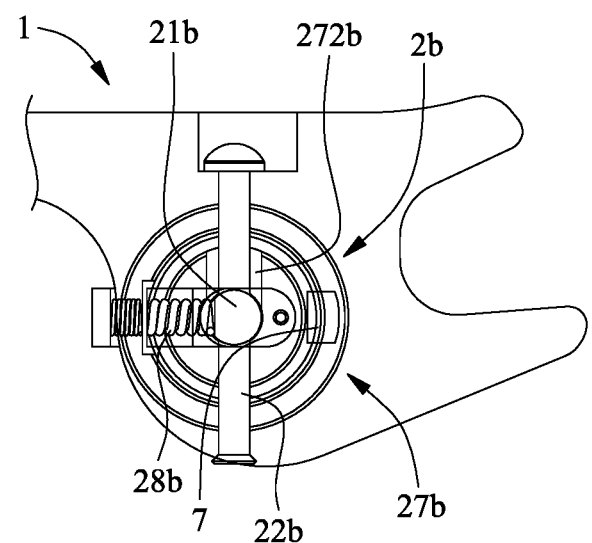
FIG. 32 is a partial enlarged schematic view of an unlatched state according to the fourth embodiment of the present invention.
Figure 33:
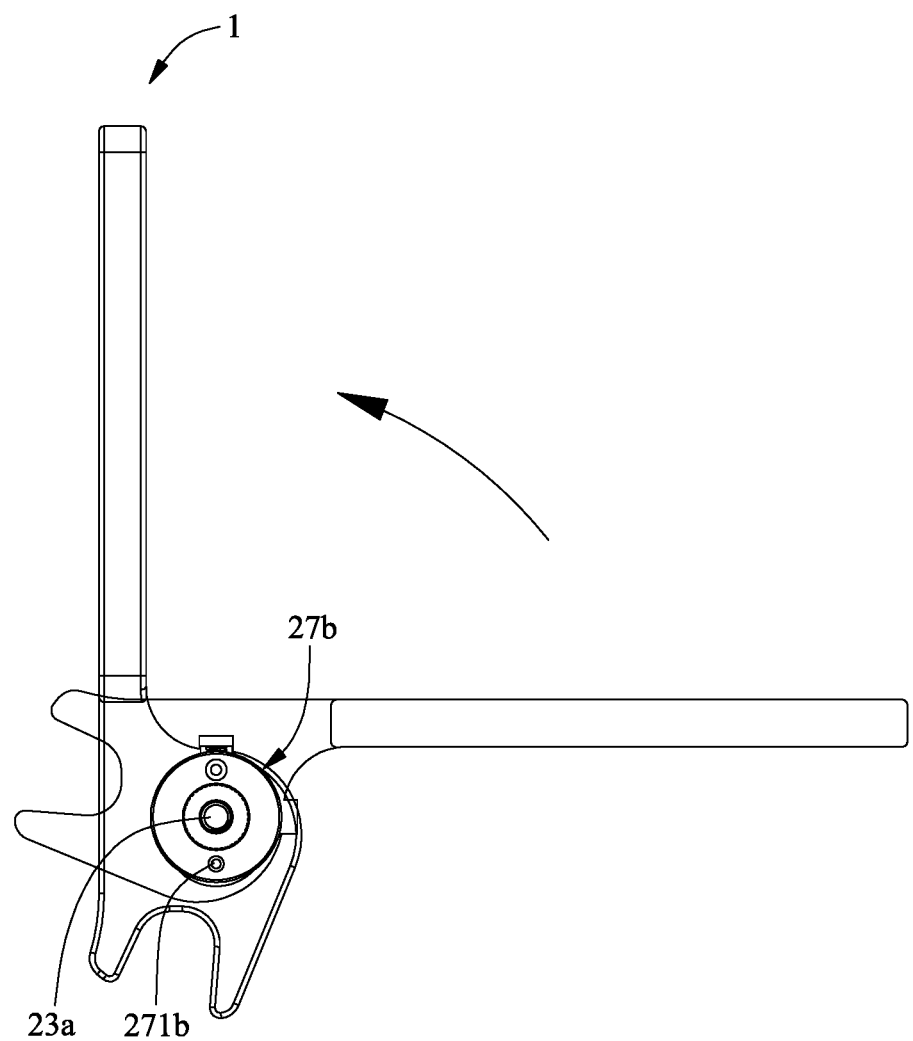
FIG. 33 is a schematic view of rotation and an unlatched state according to the fourth embodiment of the present invention.

Referring to FIG. 1 through FIG. 10, there are shown diagrams of a pull aid structure latched and unlatched according to the first embodiment of the present invention, respectively. As shown in the diagrams, the present invention provides a pull aid structure which comprises a handle 1, a connecting element 2, a positioning element 3 and an elastic element 4.

One end of the handle 1 has an abutting portion 11. The abutting portion 11 thrusts or fastens an object connected to the abutting portion 11. In this embodiment, the abutting portion 11 is a fastening structure or a thrusting structure, whereas the handle 1 has a receiving space 12.

The connecting element 2 is movably disposed in the receiving space 12 of the handle 1. The connecting element 2 has a rotating shaft 21. The rotating shaft 21 comprises a joining element 22 whereby the rotating shaft 21 is connected to the handle 1. The joining element 22 is an axle, a buckle or a post or is integrally formed with the rotating shaft 21. A fixing portion 23 is disposed on the bottom surface of the connecting element 2. The connecting element 2 has at least two adjoining portions facing backward, forward or laterally. In this embodiment, the adjoining portions are a first adjoining hole 24 and a second adjoining hole 25 which are movably coupled to, confined to, adapted to interfere with or engaged with the positioning element 3. The fixing portion 23 is a protuberance, a dent, an external thread, an internal thread, a buckle, a cascade, a plane, an arcuate surface, a curved surface or an oblique surface. The fixing portion 23 is riveted, expanded, latched, soldered, fastened, adhered or bolted to an object.

The positioning element 3 is disposed at the receiving space 12 of the handle 1 and movably coupled to (, confined to, adapted to interfere with or engaged with) the connecting element 2. The positioning element 3 comprises a thrusting rod 31, an actuating rod 32, a connector 33 for connecting the thrusting rod 31 and the actuating rod 32, and an elastic portion 34 disposed between the actuating rod 32 and the handle 1. The thrusting rod 31 has a pressing portion 311 exposed from one end of the handle 1 and a rod body 312 connected to the connector 33. The actuating rod 32 has an extending portion 321 connected to the connector 33, a bend portion 322 connected to the extending portion 321 and corresponding in position to the connecting element 2 and the elastic portion 34, a corresponding portion 323 disposed at the bend portion 322 and movably coupled to (, confined to, adapted to interfere with or engaged with) the first adjoining hole 24 or the second adjoining hole 25, and a positioning unit 324 connected the elastic portion 34. The elastic portion 34 is a coil spring, a saucer-shaped leaf spring, a C-shaped leaf spring, a wave-shaped leaf spring, an elastic post, a leaf spring or a torsion spring.

The elastic element 4 is disposed at the connecting element 2 and has two ends disposed at the handle 1 and the connecting element 2, respectively. The elastic element 4 is a coil spring, a saucer-shaped leaf spring, a C-shaped leaf spring, a wave-shaped leaf spring, an elastic post, a leaf spring or a torsion spring. The elastic element 4 has its two ends fixed in place to exert a force such that the handle 1 and the connecting element 2 elastically rotate by 5 to 360 degrees.

To facilitate operation of the pull aid structure, it is feasible that the fixing portion 23 disposed on the bottom surface of the connecting element 2 and an object are coupled together such that the handle 1 rotates about the rotating shaft 21 of the connecting element 2, thereby fastening the abutting portion 11 disposed at one end of the handle 1 and another object (not shown) together. At this point in time, the corresponding portion 323 of the actuating rod 32 disposed at the positioning element 3 is inserted into the first adjoining hole 24 of the connecting element 2 and compresses the elastic element 4; hence, the positioning element 3 and the connecting element 2 are latched together, thereby coupling the two objects together. The pull aid structure and an object (not shown) together form a module. The other object is a panel, a box, a plate, a block, a motherboard or a casing.

To separate the two objects, the user presses the pressing portion 311 of the thrusting rod 31 disposed at the positioning element 3 such that the rod body 312 of the thrusting rod 31 drives the connector 33 to pull the extending portion 321 of the actuating rod 32 and thus cause the bend portion 322 of the actuating rod 32 to move away from the connecting element 2 and compress the elastic portion 34, thereby causing separation of the corresponding portion 323 and the first adjoining hole 24. At this point in time, the handle 1 rotates relative to the connecting element 2 under a releasing force exerted by the elastic element 4 such that the handle 1 is driven by the elastic element 4 to automatically spring forward to thereby cause the positioning element 3 and the connecting element 2 to enter an unlatched state. Owing to the rotation of the handle 1, the corresponding portion 323 is inserted into the second adjoining hole 25; hence, as soon as the elastic element 4 exerts the releasing force on the handle 1, another object is moved by the abutting portion 11 such that the two objects are separated, so as to achieve quick coupling and ease of removal.

Referring to FIG. 11 through FIG. 18, there are shown diagrams of a latched state and an unlatched state according to the second embodiment of the present invention. As shown in the diagrams, in addition to the structural features of the first embodiment, the second embodiment has structural features described below. In the second embodiment, a positioning element 5 comprises a pressing portion 51 exposed from one end of the handle, an actuating rod 52 connected to the pressing portion 51, and an elastic portion 53 disposed between the actuating rod 52 and the handle 1. The pressing portion 51 and the actuating rod 52 are fastened, adhered, latched, riveted, expanded, engaged or snap-engaged together or are integrally formed. The actuating rod 52 has a bend portion 521 corresponding in position to the connecting element 2 and the elastic portion 53, a corresponding portion 522 disposed at the bend portion 521 and movably coupled to (, confined to, adapted to interfere with or engaged with) the second adjoining hole 25 or the first adjoining hole 24, and a positioning unit 523 connected to the elastic portion 53. The corresponding portion 522 is a protuberance, a dent, an external thread, an internal thread, a buckle, a cascade, a plane, an arcuate surface, a curved surface, an oblique surface, a slot or a hook. The positioning unit 523 is a slot, a hole, a pin, a convex portion, a concave portion, a cascade, a plane, an oblique surface, an arcuate surface or a curved surface.

The fixing portion 23 disposed on the bottom surface of the connecting element 2 and an object are coupled together such that the handle 1 rotates about the rotating shaft 21 of the connecting element 2, thereby allowing the abutting portion 11 disposed at one end of the handle 1 to be fastened to another object (not shown). At this point in time, the corresponding portion 522 of the actuating rod 52 disposed at the positioning element 3 is inserted into the second adjoining hole 25 of the connecting element 2 to compress the elastic element 4 such that the positioning element 5 and the connecting element 2 are latched together, thereby coupling the two objects together.

To separate the two objects, the user presses the pressing portion 51 of the positioning element 5 such that the bend portion 521 of the actuating rod 52 moves away from the connecting element 2 and compresses the elastic portion 53, causing separation of the corresponding portion 522 and the second adjoining hole 25. At this point in time, the handle 1 rotates relative to the connecting element 2 under a releasing force exerted by the elastic element 4 such that the handle 1 is driven by the elastic element 4 to automatically spring forward to thereby cause the positioning element 5 and the connecting element 2 to enter an unlatched state. Owing to the rotation of the handle 1, the corresponding portion 323 is inserted into the first adjoining hole 24; hence, as soon as the elastic element 4 exerts the releasing force on the handle 1, another object is moved by the abutting portion 11 such that the two objects are separated, so as to achieve quick coupling and ease of removal.

Referring to FIG. 19 through FIG. 25, there are shown diagrams of a latched state and an unlatched state according to the third embodiment of the present invention. As shown in the diagrams, in addition to the aforesaid structural features of the first and second embodiments, the third embodiment has structural features described below. In the third embodiment, a connecting element 2a has an adjoining portion 26a movably coupled to (, confined to, adapted to interfere with or engaged with) a positioning element 6. The positioning element 6 is engaged with the handle 1. The positioning element 6 comprises a pressing portion 61 exposed from one end of the handle 1, an actuating rod 62 connected to the pressing portion 61, a corresponding portion 63 connected to the actuating rod 62 and movably coupled to (, confined to, adapted to interfere with or engaged with) the adjoining portion 26a, a connector 64 disposed between the handle 1 and the actuating rod 62, and an elastic portion 65 disposed between the actuating rod 62 and the handle 1. The adjoining portion 26a is a hole, a slot, a protuberance, a dent, a cascade, an arcuate surface, a plane, an oblique surface, a curved surface or a buckle. The positioning element 6 is movably connected to the handle 1 by a connector 64. The connector 64 is a lever, a bolt, a buckle or a post. A movable portion 66 is disposed at the actuating rod 62 of the positioning element 6 or the handle 1 such that the positioning element 6 operates in conjunction with the connector 64 to move horizontally (or vertically). The space within which the movable portion 66 moves ranges from 0.05 mm to 500 mm.

After the two objects have been coupled together by the handle 1 and the connecting element 2a, to separate the two objects, the user presses the pressing portion 61 of the positioning element 6 such that the actuating rod 62 drives the corresponding portion 63 to escape from the adjoining portion 26a of the connecting element 2a and compress the elastic portion 65. At this point in time, the handle 1 rotates relative to the connecting element 2a under a releasing force exerted by the elastic element 4 such that the handle 1 is driven by the elastic element 4 to automatically spring forward to thereby cause the positioning element 6 and the connecting element 2a to enter an unlatched state, so as to achieve quick coupling and ease of removal.

Referring to FIG. 26 through FIG. 33, there are shown diagrams of a latched state and an unlatched state according to the fourth embodiment of the present invention. As shown in the diagrams, in addition to the aforesaid structural features of the first, second and third embodiments, the fourth embodiment has structural features described below. In the fourth embodiment, a connecting element 2b has a rotating shaft 21b. The rotating shaft 21b is movably connected to the handle 1 by a joining element 22b. The connecting element further comprises a connection unit 27b disposed at the rotating shaft 21b, a first thrust element 28b disposed between the handle 1 and the rotating shaft 21b, and a second thrust element 29b disposed between the handle 1 and the connection unit 27b. The elastic element 4 fits around the rotating shaft 21b of the connecting element 2b. The elastic element 4 has two ends disposed at the rotating shaft 21b and the connection unit 27b, respectively. A positioning portion 271b is disposed at the bottom of the connection unit 27b. Both the first thrust element 28b and the second thrust element 29b are elastic components, such as springs. A positioning element 7 is disposed in the handle 1 to movably adjoin the connection unit 27b. In this embodiment, the positioning element 7 is a convex portion (or a concave portion), whereas the connection unit 27b has a dent portion 272b (or protrusion portion) which movably adjoins a convex portion (or a concave portion). The positioning portion 271b is a protuberance, a dent, an external thread, an internal thread, a buckle, a cascade, a plane, an arcuate surface, a curved surface or an oblique surface. The positioning portion 271b is riveted, expanded, latched, soldered, fastened, adhered or bolted to an object.

Therefore, a fixing portion 23b disposed on the bottom surface of the connecting element 2b, the positioning portion 271b disposed at the bottom of the connection unit 27b, and an object can be coupled together, and the handle 1 rotates about the rotating shaft 21b such that the abutting portion 11 disposed at one end of the handle 1 and another object (not shown) are fastened together. At this point in time, the positioning element 7 in the handle 1 is inserted into the dent portion 272b of the connection unit 27b and compresses the elastic element 4, whereas the first thrust element 28b and the second thrust element 29b abut against the rotating shaft 21b and the connection unit 27b such that the connection unit 27b enters a latched state relative to the rotating shaft 21b, thereby coupling the two objects together.

To separate the two objects, the user pushes the handle 1 laterally (i.e., in the direction of the abutting portion 11) to not only compress the first thrust element 28b and the second thrust element 29b but also move the positioning element 7 in the handle 1 out of the dent portion 272b of the connection unit 27b. At this point in time, the handle 1 and the connection unit 27b rotate under the releasing force of the elastic element 4 to not only cause the positioning element 7 and the connection unit 27b to enter an unlatched state but also cause the abutting portion 11 to move another object away such that the two objects separate, thereby achieving quick coupling and ease of removal.

Figure 34:
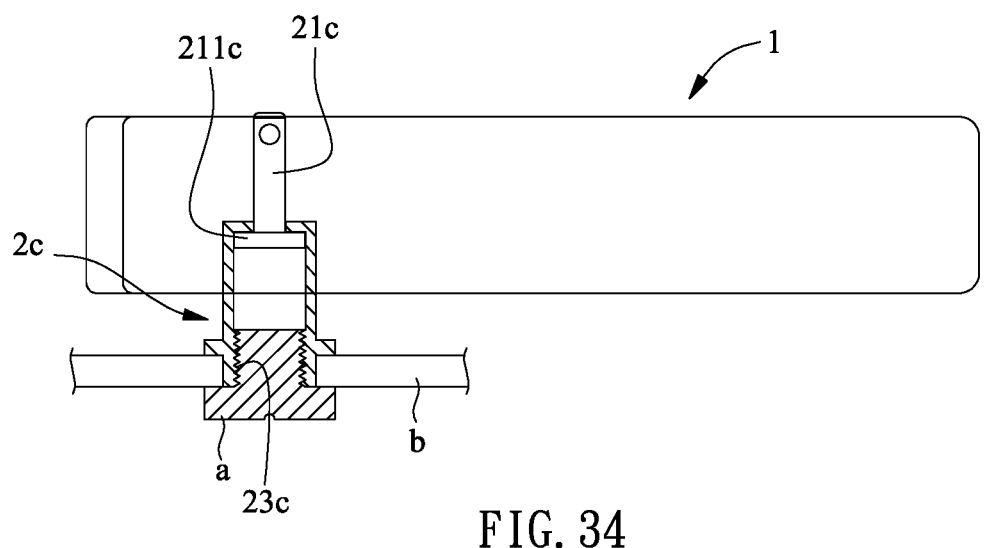
FIG. 34 is a schematic view of the fifth embodiment of the present invention.

Referring to FIG. 34, there is shown a schematic view of the fifth embodiment of the present invention. As shown in the diagram, in the fifth embodiment, a rotating shaft 21c has a blocking portion 211c, whereas the blocking portion 211c and a connecting element 2c are connected to each other or confined to each other. A fixing portion 23c of the connecting element 2c is an internal thread latched to an object b by a counter-latching element a. The fixing portion 23c is a protuberance, a dent, an external thread, a buckle, a cascade, a plane, an arcuate surface, a curved surface or an oblique surface (not shown), as needed, such that the fixing portion 23c is riveted, expanded, latched, soldered, fastened, adhered or bolted (not shown) to the object b.

Figure 35:
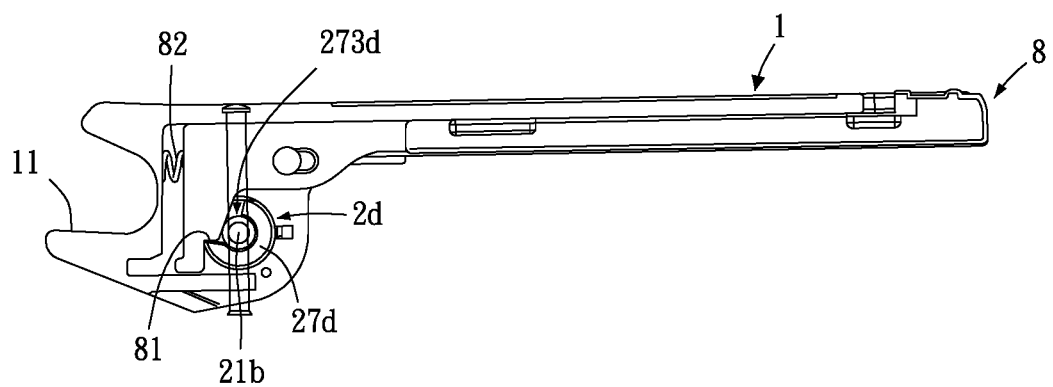
FIG. 35 is a schematic view of the sixth embodiment of the present invention.

Referring to FIG. 35, there is shown a schematic view of the sixth embodiment of the present invention. As shown in the diagram, in the sixth embodiment, a positioning element 8 has an engaging convex portion 81, whereas a connection unit 27d of a connecting element 2d has a notch portion 273d for movably engaging with the engaging convex portion 81. An elastic component 82 is disposed between the positioning element 8 and the handle 1.

Therefore, the connecting element 2d and an object are coupled together, and the handle 1 rotates about the rotating shaft 21b such that the abutting portion 11 disposed at one end of the handle 1 and another object are fastened together (not shown). At this point in time, the engaging convex portion 81 of the positioning element 8 becomes engaged with the notch portion 273d and thus positioned therein, thereby coupling the two objects together.

To separate the two objects, the user moves the positioning element 8 laterally (i.e., in the direction of the abutting portion 11) to compress the elastic component 82 and enable the engaging convex portion 81 to move the notch portion 273d away. At this point in time, the handle 1 and the connection unit 27d rotate under the releasing force of an elastic element (not shown) of the connecting element 2d such that the abutting portion 11 moves another object away; hence, the two objects separate, thereby achieving quick coupling and ease of removal.

Figure 36:
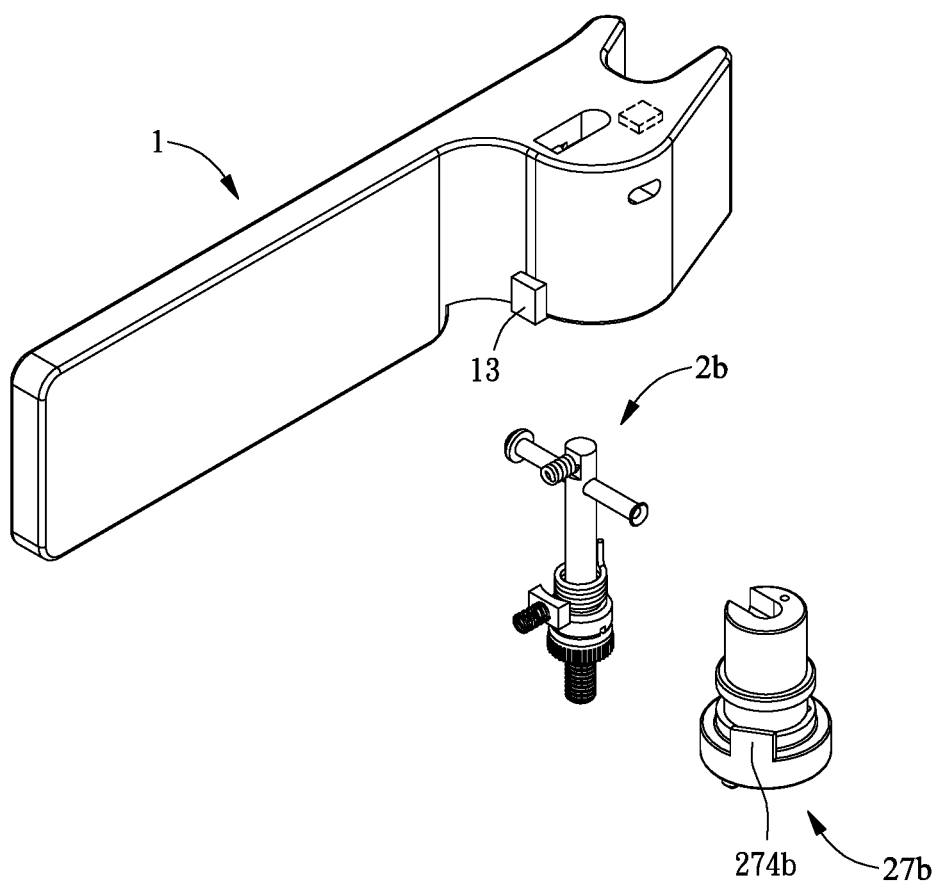
FIG. 36 is a schematic view of the seventh embodiment of the present invention.

Referring to FIG. 36, there is shown a schematic view of the seventh embodiment of the present invention. As shown in the diagram, in the seventh embodiment, the handle 1 has a stopping portion 13, whereas the connection unit 27b of the connecting element 2b has a corresponding checking portion 274b. The corresponding checking portion 274b is disposed outside the handle 1. The corresponding checking portion 274b and the stopping portion 13 are confined to each other or adapted to stop each other while the handle 1 is rotating.

The present invention is disclosed above by preferred embodiments. However, persons skilled in the art should understand that the preferred embodiments are illustrative of the present invention only, but should not be interpreted as restrictive of the scope of the present invention. Hence, all equivalent modifications and replacements made to the aforesaid embodiments should fall within the scope of the present invention. Accordingly, the legal protection for the present invention should be defined by the appended claims.

What is claimed is:

1. A pull aid structure, comprising:
   a handle;
   a connecting element movably disposed at the handle; and
   a positioning element having a corresponding portion disposed at the handle and movably coupled to an adjoining portion of the connecting element to allow the handle to escape from the connecting element and thus rotate or move as soon as the positioning element escapes from the connecting element;
   wherein the connecting element is fitted around by an elastic element and the elastic element is a torsion spring, whereas two ends of the elastic element are disposed at the handle and the connecting element, respectively, thereby providing a rotating force to the handle to escape from the connecting element when the positioning element escapes from the connecting element.

2. The pull aid structure of claim 1, wherein the handle has an abutting portion and a receiving space for receiving the connecting element or the positioning element.

3. The pull aid structure of claim 1, wherein the connecting element has a rotating shaft connected to the handle or provided with a joining element whereby the rotating shaft is connected to the handle.

4. The pull aid structure of claim 3, wherein a first thrust element or a second thrust element is disposed between the handle and the connecting element or between the handle and the rotating shaft.

5. The pull aid structure of claim 3, wherein the rotating shaft has a blocking portion such that the blocking portion and the connecting element are connected to each other or confined to each other.

6. The pull aid structure of claim 1, wherein the adjoining portion of the connecting element is movably coupled to, confined to, adapted to interfere with or engaged with the positioning element, the positioning element further comprising a pressing portion disposed at an end of the handle and an actuating rod connected to the pressing portion, with the corresponding portion connected to the actuating rod and movably coupled to, confined to, adapted to interfere with or engaged with the adjoining portion.

7. The pull aid structure of claim 1, wherein the connecting element comprises a connection unit with a positioning portion.

8. The pull aid structure of claim 1, wherein the positioning element and the handle are movably connected by a connector.

9. The pull aid structure of claim 1, wherein the handle or the positioning element has a movable portion whereby the positioning element moves horizontally or vertically.

10. The pull aid structure of claim 1, wherein an elastic portion is disposed between the positioning element and the handle, between the handle and the connecting element, or between the connecting element and the positioning element.

11. The pull aid structure of claim 1, wherein the handle has a stopping portion, and the connecting element has a corresponding checking portion such that the corresponding checking portion and the stopping portion are confined to each other or adapted to stop each other.

12. The pull aid structure of claim 1, wherein the corresponding portion of the positioning element is integrally formed with the handle or is a bump, a protuberance, a dent, a slot, a hole, a buckle, a hook, a plate or a block which is connectedly formed to restrict the adjoining portion of the connecting element.

13. A pull aid structure, comprising:
   a handle;
   a connecting element movably disposed at the handle; and
   a positioning element having a corresponding portion disposed at the handle and movably coupled to an adjoining portion of the connecting element to allow the handle to escape from the connecting element and thus rotate or move as soon as the positioning element escapes from the connecting element;
   wherein a coil spring is disposed between the handle and the connecting element, and the handle linearly moves relative to the connecting element.

* * * * *